(12) United States Patent
Alpman et al.

(10) Patent No.: US 11,677,413 B2
(45) Date of Patent: Jun. 13, 2023

(54) AUDIO ADC FOR SUPPORTING VOICE WAKE-UP AND ELECTRONIC DEVICE

(71) Applicant: Radiawave Technologies Co., Ltd., Shenzhen (CN)

(72) Inventors: Erkan Alpman, Portland, OR (US); Xiaofeng Guo, Shenzhen (CN); Jon Sweat Duster, Beaverton, OR (US); Yulin Tan, Shenzhen (CN); Ning Zhang, Shenzhen (CN); Haigang Feng, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 123 days.

(21) Appl. No.: 17/508,096

(22) Filed: Oct. 22, 2021

(65) Prior Publication Data

US 2022/0045690 A1 Feb. 10, 2022

Related U.S. Application Data

(63) Continuation of application No. PCT/CN2020/085170, filed on Apr. 16, 2020.

(30) Foreign Application Priority Data

Apr. 23, 2019 (CN) .......................... 201910331416.4

(51) Int. Cl.
*H03M 1/12* (2006.01)
*H03M 1/46* (2006.01)
(Continued)

(52) U.S. Cl.
CPC ............. *H03M 1/468* (2013.01); *G10L 15/22* (2013.01); *H03G 3/3005* (2013.01); *H03M 1/462* (2013.01); *H04R 3/00* (2013.01)

(58) Field of Classification Search
CPC .... H03M 1/06; H03M 1/0629; H03M 1/1245; H03M 1/00; H03M 1/10; H03M 1/1009;
(Continued)

(56) References Cited

U.S. PATENT DOCUMENTS 6,233,438 B1 * 5/2001 Wynn .................... H04W 52/52
455/116
2003/0185408 A1 10/2003 Causevic et al.
(Continued)

FOREIGN PATENT DOCUMENTS

CN 1968545 A 5/2007
CN 102386924 A 3/2012
(Continued)

OTHER PUBLICATIONS

First Office Action issued in counterpart Chinese Patent Application No. 201910331416.4, dated Oct. 26, 2021.
(Continued)

*Primary Examiner* — Linh V Nguyen
(74) *Attorney, Agent, or Firm* — Westbridge IP LLC

(57) ABSTRACT

Disclosed are an audio ADC for supporting voice wake-up and an electronic device. The audio ADC includes a programmable gain amplifier (PGA) having an input terminal for receiving an audio signal; a bypass switch having an input terminal for receiving an analog audio signal; and a successive approximation ADC having input terminals respectively connected to output terminals of the PGA and the bypass switch; the PGA gains and amplifies the audio signal, the bypass switch bypasses the PGA, and outputs the analog audio signal; the successive approximation performs analog-to-digital conversion with noise shaping on the analog audio signal after gain amplification at a first sampling rate/oversampling rate when the audio ADC is normal working, and turns off noise shaping when the audio ADC (Continued)

is sleep, performs analog-to-digital conversion on the analog audio signal output by the bypass switch at a second sampling rate/oversampling rate, and outputs to a DSP.

10 Claims, 2 Drawing Sheets

(51) Int. Cl.
*G10L 15/22* (2006.01)
*H03G 3/30* (2006.01)
*H04R 3/00* (2006.01)

(58) Field of Classification Search
CPC ...... H03M 1/12; H03M 1/462; H03M 1/0818; H03M 1/0854; H03M 1/38; H03M 1/68; H03M 1/02; H03M 1/125; H03M 3/368; H03M 1/0881; H03M 1/66; G10L 15/22; G10L 2015/223; G10L 25/21; G10L 25/84; H03F 1/303; H03F 2203/45652; H03F 2203/7239; H03F 3/19; H03F 3/2175; H03F 3/45475; H03F 3/72; H03G 1/0035; H03G 3/20; H03G 3/3036
USPC .......................... 341/118, 120, 115, 172, 143
See application file for complete search history.

(56) References Cited

U.S. PATENT DOCUMENTS

| | | | | |
|---|---|---|---|---|
| 2004/0219959 A1* | 11/2004 | Khayrallah | .......... | H04B 7/0877 455/574 |
| 2005/0207602 A1 | 9/2005 | Oerle | | |
| 2009/0140802 A1* | 6/2009 | Kitagawa | .............. | H03M 3/342 330/9 |
| 2010/0008338 A1* | 1/2010 | Tsfati | ................... | H04B 1/0067 455/41.2 |
| 2014/0070976 A1* | 3/2014 | Hurrell | .................. | G11C 27/02 341/172 |
| 2016/0276983 A1* | 9/2016 | Vaillancourt | ............. | H03F 3/72 |
| 2017/0317683 A1* | 11/2017 | Bandyopadhyay | ... | H03M 3/426 |
| 2018/0132750 A1* | 5/2018 | Kalb | ..................... | H03M 3/414 |
| 2018/0138878 A1* | 5/2018 | Domino | ............. | H03F 3/45475 |
| 2018/0143229 A1 | 5/2018 | Shuto et al. | | |
| 2018/0309413 A1* | 10/2018 | D'Souza | ............. | H03F 3/45937 |
| 2019/0198043 A1* | 6/2019 | Crespi | ..................... | G10L 15/22 |

FOREIGN PATENT DOCUMENTS

| | | |
|---|---|---|
| CN | 103959660 A | 7/2014 |
| CN | 104038864 A | 9/2014 |
| CN | 109217874 A | 1/2019 |
| CN | 109587588 A | 4/2019 |
| CN | 110071700 A | 7/2019 |
| TW | 201843582 A | 12/2018 |

OTHER PUBLICATIONS

International Search Report and Written Opinion issued in corresponding PCT Application No. PCT/CN2020/085170, dated Jul. 14, 2020.
Shen, Design of Intelligent Remote Controller for Human-Computer Interaction Based on 2.4G Wireless Transmission, Dissertation Submitted to Hangzhou Dianzi University for the Degree of Master, dated Dec. 31, 2013.
Texas Instruments, PCM186x 4-Channel or 2-Channel, 192-kHZ, Audio ADCs, retrieved via https://www.ti.com/lit/gpn/PCM1863, dated Dec. 31, 2018.
Wu et al., Controller Design and Implementation in Active Control, pp. 126-127, Harbin Engineering University Press, Harbin, China, dated Apr. 30, 2017.

* cited by examiner

AUDIO ADC FOR SUPPORTING VOICE WAKE-UP AND ELECTRONIC DEVICE

CROSS-REFERENCE TO RELATED APPLICATIONS

This application is a continuation application of International Application No. PCT/CN2020/085170, filed on Apr. 16, 2020, which claims priority to Chinese Patent Application No. 201910331416.4, filed on Apr. 23, 2019, the entire disclosure of which is incorporated herein by reference.

TECHNICAL FIELD

The present disclosure relates to the technical field of electronic circuits, and in particular to an audio analog-to-digital converter (ADC) for supporting voice wake-up and an electronic device.

BACKGROUND

Sleep Always On Power (AON) mode and normal working mode are generally set in smart electronic devices. In the AON mode, only modules in the electronic device that must be powered on will be powered, such as a microphone used to wake up the user, to continuously monitor potential voice commands in the environment.

However, the power cost of continuously monitoring potential voices in the environment is high. The voice wake-up function will cause system power or battery consumption, and the run time of electronic devices is short, which brings certain resistance to the promotion of voice wake-up technology.

SUMMARY

The main objective of the present disclosure is to provide an audio ADC for supporting voice wake-up and an electronic device, which aims to reduce power consumption in sleep mode and saves the layout area of the audio ADC.

In order to achieve the above objective, the present disclosure provides an audio analog-to-digital converter (ADC) for supporting voice wake-up, including:

a programmable gain amplifier having an input terminal for receiving an audio signal;

a bypass switch having an input terminal for receiving an analog audio signal; and a successive approximation ADC with noise shaping capability having input terminals respectively connected to output terminals of the programmable gain amplifier and the bypass switch;

the programmable gain amplifier is configured to gain and amplify the audio signal, the bypass switch is configured to bypass the programmable gain amplifier when turned on, and output the analog audio signal;

the successive approximation is configured to perform analog-to-digital conversion on the analog audio signal after gain amplification at a first sampling rate/oversampling rate when the audio ADC is in a normal working mode, and the successive approximation is configured to turn off noise shaping when the audio ADC is in a sleep mode, perform analog-to-digital conversion on the analog audio signal output by the bypass switch at a second sampling rate/oversampling rate, and output the analog audio signal after the analog-to-digital conversion to a digital signal processor (DSP) to wake up the DSP; and the first sampling rate/oversampling rate is greater than the second sampling rate/oversampling rate.

In at least one embodiment, the second sampling rate/oversampling rate is 1 to 16.

In at least one embodiment, when the audio ADC is in the normal working mode, a dynamic range of the successive approximation ADC is greater than 90 dB; and when the audio ADC is in the sleep mode, a dynamic range of the successive approximation ADC is 70 dB.

In at least one embodiment, the successive approximation ADC includes a successive approximation analog-to-digital conversion module and a noise shaping circuit, an input terminal of the successive approximation analog-to-digital conversion module is connected to an output terminal of the programmable gain amplifier, a margin transfer output terminal of the successive approximation analog-to-digital conversion module is connected to an input terminal of the noise shaping circuit, and an output terminal of the noise shaping circuit is connected to a margin input terminal of the successive approximation analog-to-digital conversion module;

the noise shaping circuit is configured to transfer a margin signal of the successive approximation analog-to-digital conversion module; and the successive approximation analog-to-digital conversion module is configured to control the noise shaping circuit to stop working after the audio ADC is in the sleep mode, to turn off the noise shaping, and perform analog-to-digital conversion on the analog audio signal output by the bypass switch.

In at least one embodiment, the successive approximation analog-to-digital conversion module includes a comparator, a sampling switch circuit, a logic control circuit, a margin transfer switch circuit and a DAC capacitor array, the DAC capacitor array includes a first DAC capacitor array and a second DAC capacitor array forming a differential structure;

a control terminal of the logic control circuit is respectively connected to a controlled terminal of the sampling switch circuit, a controlled terminal of the margin transfer switch circuit, and a controlled terminal of the noise shaping circuit;

a first terminal of the sampling switch circuit is configured to input a differential analog audio signal, a second terminal of the sampling switch circuit is connected to a first input terminal of the DAC capacitor array, a first output terminal of the DAC capacitor array is connected to an input terminal of the margin transfer switch circuit; and two input terminals of the comparator are connected to the input terminal of the noise shaping circuit, and an output terminal of the comparator is connected to an input terminal of the logic control circuit.

In at least one embodiment, the logic control circuit includes a SAR logic controller and a clock generator; a control terminal of the SAR logic controller is connected to a controlled terminal of the sampling switch circuit, and a signal terminal of the clock generator is connected to a signal terminal of the SAR logic controller;

the clock generator is configured to output a fixed-width pulse signal to the SAR logic controller, to make the SAR logic controller control the noise shaping circuit to operate; and the SAR logic controller is configured to output a control signal to control the controlled terminal of the sampling switch circuit and the margin transfer switch circuit to operate.

In at least one embodiment, the noise shaping circuit includes a margin transfer module, a margin holding capacitor module, a current rudder, a reset switch module, and a charge sharing switch module;

a first controlled terminal of the margin transfer module is connected to the DAC capacitor array;

an input terminal of the margin transfer module is connected to a power output terminal of the current rudder;

an output terminal of the margin transfer module is interconnected with a first terminal of the margin holding capacitor module, a second terminal of the charge sharing switch module, and a first terminal of the reset switch module;

a second terminal of the margin holding capacitor module and a second terminal of the reset switch module are both grounded; and a second controlled terminal of the margin transfer module, a controlled terminal of the charge sharing switch module, and a controlled terminal of the reset switch module are all connected to the control terminal of the logic control circuit.

In at least one embodiment, the current rudder is also connected to the DSP, and the DSP is configured to control the current rudder to output a changing static working current to keep the gain of the margin transfer module constant.

In at least one embodiment, the audio ADC further includes a register, and an audio signal input interface connected to the input terminal of the programmable gain amplifier.

The present disclosure further provides an electronic device, including the audio ADC for supporting voice wake-up as described above.

In the present disclosure, the audio ADC includes a bypass switch. The bypass switch is turned off when the audio ADC is working normally, so that the programmable gain amplifier will gain and amplify the audio signal and output the audio signal to the successive approximation ADC while the noise-shaping module is on in order to provide high dynamic range. The sampling switch samples at the first sampling rate/oversampling rate, and the ADC completes the analog-to-digital conversion of the audio signal. The bypass switch is turned on when the audio ADC is in sleep mode, thereby bypassing the PGA, and the bypass switch directly outputs the analog audio signal to the successive approximation ADC, and the successive approximation ADC turns off the noise shaping. The successive approximation ADC performs analog-to-digital conversion on the analog audio signal outputted by the bypass switch at the second sampling rate/oversampling rate, and then outputs the analog audio signal to a DSP to wake up the DSP, thereby waking up the DSP. This application implements the voice wake-up function by reducing the sampling rate/oversampling rate of the successive approximation ADC and turning off the noise shaping, which reduces the power consumption in sleep mode and also saves the layout area of the audio ADC.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

Figure 1:
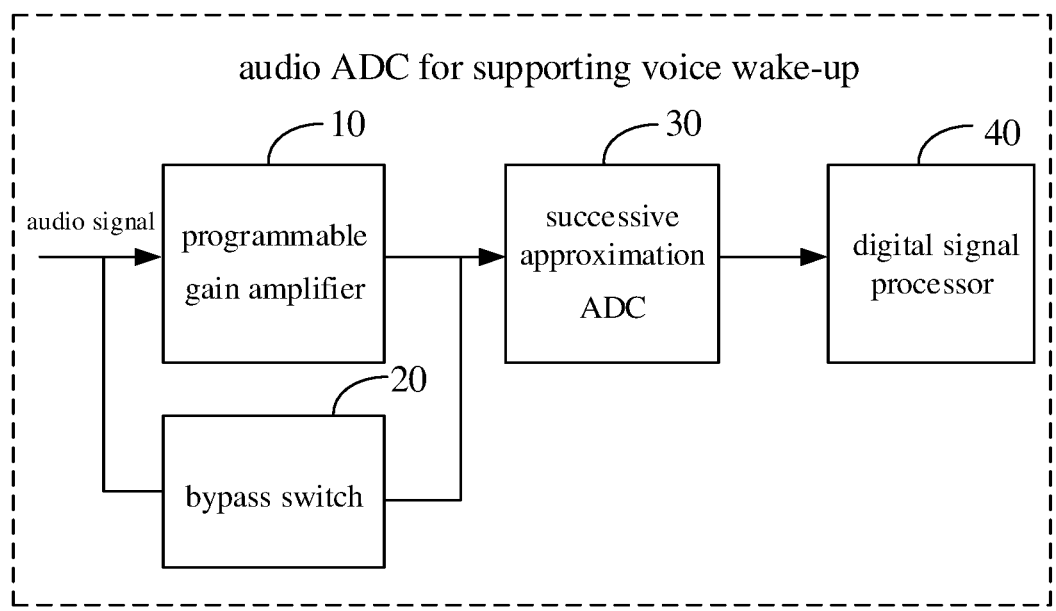
FIG. 1 is a functional schematic diagram of an audio ADC for supporting voice wake-up according to an embodiment of the present disclosure.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

In addition, the descriptions associated with, e.g., "first" and "second," in the present disclosure are merely for descriptive purposes and cannot be understood as indicating or suggesting relative importance or impliedly indicating the number of the indicated technical feature. Therefore, the feature associated with "first" or "second" can expressly or impliedly include at least one such feature. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides an audio analog-to-digital converter (ADC) for supporting voice wake-up, which is suitable for electronic devices that can receive audio signals.

The electronic device can be a mobile phone, a tablet computer, a wearable smart electronic device (such as a wireless headset, a smart watch), a notebook computer, a handheld computer, a personal digital assistant (PDA), a portable media player (PAP), a smart bracelet, a pedometer, a remote controller, or the like.

The electronic device can be set to five working modes: sleep mode, low power mode, normal mode, always on power (AON) mode, and power down mode.

In the AON mode, only the modules that must be powered on in the electronic device will be powered, such as the microphone and the audio ADC with voice wake-up function. Other modules, such as radio frequency channels, can be turned off through the microprogrammed control unit (MCU). The microphone can detect the voice commands input by the user in real time and perform voice recognition to achieve continuous monitoring of potential voice commands in the environment. The microphone can output the monitored voice signal to the audio ADC and trigger the MCU to work when the voice wake-up signal is monitored.

The audio ADC is usually composed of audio signal processing related modules such as programmable gain amplifier (PGA), audio ADC and digital signal processor (DSP). The power consumption of PGA and audio ADC is usually in the order of tens of mW (the power consumption of the audio ADC is in the order of several mW to a dozen mW), which is a huge power consumption expenditure for sleep mode. The signal bandwidth of the audio ADC is 20 KHz to 96 KHz, and over sampling is needed to provide a large dynamic range. The generally adopted structure is a sigma-delta modulator, the main part of its power consumption is by the integrator/resonator (limited gain bandwidth operational amplifier). Therefore, the main power consumption is static power consumption, and the power consumption cannot be effectively reduced by reducing the sampling frequency (reducing the over sampling rate (OSR) will reduce the dynamic range at the same time), that is, it cannot support voice wake-up with ultra-low power consumption (<1 mW).

To this end, in order to achieve ultra-low-power voice wake-up for most audio ADC, the audio signal processing related modules such as PGA, audio ADC and DSP will be turned off when in sleep mode. A low-power auxiliary ADC is added to the audio ADC to connect to the DSP as a wake-up function module. However, this method requires a lot of additional layout area, which is easy to increase the overall area of the audio ADC.

As shown in FIG. 1, in an embodiment of the present disclosure, the audio ADC for supporting voice wake-up includes:

a programmable gain amplifier 10, an input terminal of the programmable gain amplifier 10 being connected to audio signal, to gain and amplify the audio signal;

a bypass switch 20, an input terminal of the bypass switch 20 being connected to an analog audio signal, to bypass the programmable gain amplifier 10 when turned on, and output the analog audio signal; and a successive approximation ADC 30, input terminals of the successive approximation ADC 30 being respectively connected to output terminals of the programmable gain amplifier 10 and the bypass switch 20, the successive approximation ADC 30 is configured to perform analog-to-digital conversion with noise-shaping on the analog audio signal after gain amplification at a first sampling rate/oversampling rate when the audio ADC is in a normal working mode;

the successive approximation ADC is further configured to turn off noise shaping when the audio ADC is in the sleep mode, perform analog-to-digital conversion on the analog audio signal outputted by the bypass switch 20 at a second sampling rate/oversampling rate, and output digital audio signal to a digital signal processor (DSP) 40 to wake up the DSP 40; the first sampling rate/oversampling rate is greater than the second sampling rate/oversampling rate.

In this embodiment, the programmable gain amplifier 10 can be realized by using an automatic gain amplifier, or a combination of an automatic gain amplifier and a fixed gain amplifier. When a fixed gain amplifier is used, the user can adjust the gain multiple, for example, the multiple of the amplification gain can be manually adjusted.

The bypass switch 20 is turned off when the audio ADC is working normally, and the programmable gain amplifier 10 is working normally, and the connected audio signal is gain-amplified and outputted to the successive approximation analog-to-digital converter 30. The bypass switch 20 is turned on when the audio ADC is in the sleep mode to bypass the PGA, and the bypass switch 20 directly outputs the connected analog audio signal to the SAR ADC.

It can be understood that when the ADC 30 is working in the deep sleep mode, the DSP 40 is also in the deep sleep mode. The DSP 40 can work by receiving a key signal. For an electronic device having a voice signal recording function, such as a mobile phone, a tablet computer, a wearable smart electronic device (such as a wireless earphone, a smart watch), or the like, the DSP 40 can recover from a sleep state to a normal working state through the microphone 100 and an audio ADC that is awakened by voice.

The successive approximation ADC 30 can further improve the accuracy of the SAR ADC through the combination of noise shaping technology and oversampling on the basis of high precision (12 bits to 14 bits), so as to provide the same high dynamic range. The dynamic power consumption of the successive approximation ADC 30 is proportional to the sampling rate, according to the working mode of the successive approximation ADC 30, it works at different sampling rates, such that the second sampling rate/oversampling rate in the sleep mode is less than the first sampling rate/oversampling rate in the normal working mode.

The second sampling rate/oversampling rate can be 1 to 16, and the first sampling rate/oversampling rate can be 64, 128 or 256.

The successive approximation ADC 30 can be in communication with the DSP 40. The successive approximation ADC 30 can determine the working state of the DSP 40 according to the communication signal output by the DSP 40, and when it is determined that the DSP 40 is in the sleep mode, the power consumption in the sleep mode is reduced by turning off the noise shaping and reducing the sampling rate. Although the dynamic range will also be reduced, it can also meet the requirements of the voice wake-up function and realize the voice wake-up of the DSP 40. Therefore, no additional low-power auxiliary ADC is required, which saves layout area.

In the present disclosure, the audio ADC includes a bypass switch 20. The bypass switch 20 is turned off when the audio ADC is working normally, so that the programmable gain amplifier 10 will gain and amplify the audio signal and output the audio signal to the successive approximation ADC 30. The bypass switch samples at the first sampling rate/oversampling rate and completes the analog-to-digital conversion of the audio signal. The bypass switch 20 is turned on when the audio ADC is in sleep mode, thereby bypassing the PGA, and the bypass switch 20 directly outputs the analog audio signal to the successive approximation ADC 30, and the successive approximation ADC 30 turns off the noise shaping. The successive approximation ADC 30 performs analog-to-digital conversion on the analog audio signal output by the bypass switch 20 at the second sampling rate/oversampling rate, and then outputs the analog audio signal to the DSP 40 to wake up the DSP 40, thereby waking up the DSP 40. This application implements the voice wake-up function by reducing the sampling rate/oversampling rate of the successive approximation ADC 30 and turning off the noise shaping, which reduces the power consumption in sleep mode and also saves the layout area of the audio ADC.

Figure 2:
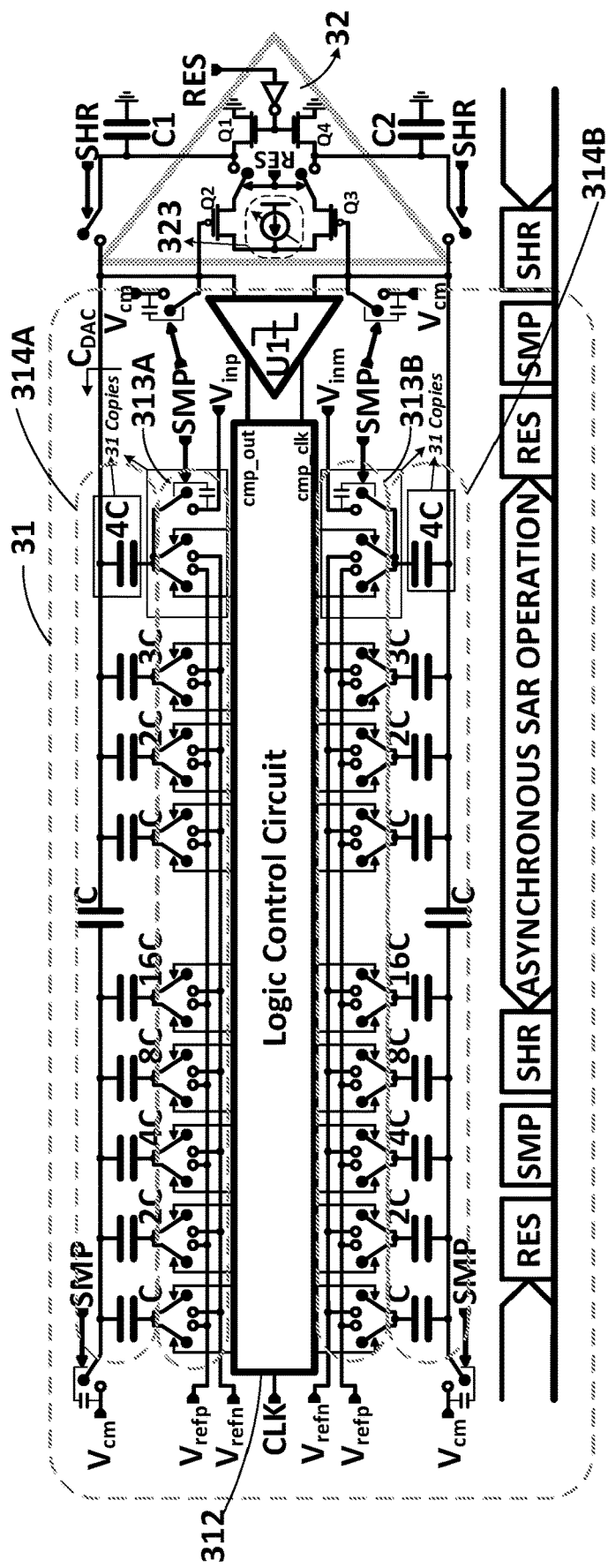
FIG. 2 is a schematic diagram of a circuit structure of a successive approximation ADC in FIG. 1 and a time sequence diagram of the successive approximation ADC.

As shown in FIG. 1 and FIG. 2, in an embodiment, when the audio ADC is in the normal working mode, the dynamic range of the successive approximation ADC 30 is greater than 90 dB.

When the audio ADC is in the sleep mode, the dynamic range of the successive approximation ADC 30 is 70 dB.

In this embodiment, in the power composition of the successive approximation ADC 30, the power consumption of the noise shaping and the dynamic power consumption of SAR ADC (proportional to the sampling rate) account for more than 99.9% of the total power consumption. Turning off noise shaping and reducing the sampling rate can effectively reduce the power consumption in sleep mode. Although the dynamic range has been reduced, it can also meet the requirements of the voice wake-up function, no additional low-power auxiliary ADC is required, which can save layout area.

As shown in FIG. 1 and FIG. 2, in an embodiment, the successive approximation ADC 30 includes a successive approximation analog-to-digital conversion module 31 and a noise shaping circuit 32, an input terminal of the successive approximation analog-to-digital conversion module 31 is connected to an output terminal of the programmable gain amplifier 10, a margin transfer output terminal of the successive approximation analog-to-digital conversion module 31 is connected to an input terminal of the noise shaping circuit 32, and an output terminal of the noise shaping circuit 32 is connected to a margin input terminal of the successive approximation analog-to-digital conversion module 31;

the noise shaping circuit 32 is configured to transfer margin signal of the successive approximation analog-to-digital conversion module 31; and the successive approximation analog-to-digital conversion module 31 is configured to control the noise shaping circuit 32 to stop working after the audio ADC is in the sleep mode, to turn off the noise shaping, and perform analog-to-digital conversion on the analog audio signal output by the bypass switch 20.

In this embodiment, the successive approximation analog-to-digital conversion module 31 is an analog-to-digital conversion module with a resolution of 12 bits, including high 7 bits and low 5 bits to achieve successive approximation conversion. The successive approximation analog-to-digital conversion module 31 superimposes the sampled audio signal and the margin signal to the noise shaping circuit 32. The noise shaping circuit 32 outputs to the successive approximation analog-to-digital conversion module 31 after realizing margin amplification and margin transfer, so as to realize the analog-to-digital conversion of the audio signal with the desired noise-transfer-function.

As shown in FIG. 2, in an embodiment, the successive approximation analog-to-digital conversion module 31 includes a comparator U1, a sampling switch circuit (311A, 311B, 313C, 313D), a logic control circuit 312, a margin transfer switch circuit (313A, 313B) and a DAC capacitor array (314A, 314B), the DAC capacitor array includes a first DAC capacitor array 314A and a second DAC capacitor array 314B forming a differential structure;

a control terminal of the logic control circuit 312 is respectively connected to a controlled terminal of the sampling switch circuit 311, a controlled terminal of the margin transfer switch circuit 313, and a controlled terminal of the noise shaping circuit 32;

a first terminal of the sampling switch circuit inputs a differential analog audio signal, a second terminal of the sampling switch circuit is connected to a first input terminal of the DAC capacitor array, a first output terminal of the DAC capacitor array is connected to an input terminal of the margin transfer switch circuit 313; and two input terminals of the comparator U1 are connected to the input terminal of the noise shaping circuit 32, and an output terminal of the comparator U1 is connected to an input terminal of the logic control circuit 312.

In this embodiment, the successive approximation analog-to-digital conversion module 31 is suitable (but not limited) for the first-order noise shaping successive approximation ADC 30 with any bit width. The accuracy of the successive approximation analog-to-digital conversion module 31 determines the conversion accuracy of the analog-to-digital converter. The concept of margin transfer is to transfer and accumulate the error generated after each conversion (for SAR ADC, margin is error) and accumulate it to the next sampling input, so as to realize a first-order sigma-delta modulator on the basis of SAR ADC. Due to the existence of the margin transfer loop, the error will be multiplied by a high-pass transfer function, so low-frequency noise will be shaped to high-frequency, and then high-frequency noise will be filtered through a digital filter to achieve ultra-high precision.

The first DAC capacitor array 314A includes a first sub-capacitor array and a second sub-capacitor array that are used to form different bits of high and low. The second DAC capacitor array 314B includes a third sub-capacitor array and a fourth sub-capacitor array that are used to form different bits of high and low. The plurality of first sub-capacitor arrays are sequentially set from low bit to high bit in a binary weighted manner according to the capacitance with some redundancy. The plurality of second sub-capacitor arrays are sequentially set from high bit to low bit in a binary weighted manner. The first sub-capacitor array and the second sub-capacitor array are connected in parallel. The plurality of third sub-capacitor arrays are arranged in sequence from low bit to high bit in a binary weighted manner according to the capacitance with some redundancy. The plurality of fourth sub-capacitor arrays are sequentially set from high bit to low bit in a binary weighted manner. The third sub-capacitor array and the fourth sub-capacitor array are connected in parallel.

The capacitance of the first DAC capacitor array 314A is 4 times the capacitance of the first margin holding capacitor C1. The capacitance of the second DAC capacitor array 314B is 4 times the capacitance of the second margin holding capacitor C2. In the successive approximation analog-to-digital conversion module 31, when the capacitances of the first margin holding capacitor C1 and the second margin holding capacitor C2 are both 1C, the equivalent capacitance value of the lower 5 bits is $\frac{1}{32}C$.

As shown in FIG. 1 and FIG. 2, in an embodiment, the logic control circuit 312 includes a SAR logic controller (not shown) and a clock generator (not shown); a control terminal of the SAR logic controller is connected to a controlled terminal of the sampling switch circuit, and a signal terminal of the clock generator is connected to a signal terminal of the SAR logic controller;

the clock generator is configured to output a fixed-width pulse signal to the SAR logic controller, to make the SAR logic controller control the noise shaping circuit 32 to operate; and the SAR logic controller is configured to output a control signal to control the controlled terminal of the sampling switch circuit 311 and the margin transfer switch circuit 313 to operate.

In this embodiment, the SAR logic controller outputs the reset signal to the reset switch module, outputs the sampling signal to the sampling switch circuit, outputs the charge sharing signal to the charge sharing switch module and receives the fixed-width pulse signal output by the clock generator and output it to the margin transfer module after the reset signal is output, so as to sequentially realize charge reset, margin transfer, charging of the margin holding capacitor module, sampling, and charge sharing.

As shown in FIG. 1 and FIG. 2, in an embodiment, the noise shaping circuit 32 includes a margin transfer module (not shown), a margin holding capacitor module (not shown), a current rudder 321, a reset switch module (not shown), and a charge sharing switch module (not shown); a first controlled terminal of the margin transfer module is connected to the DAC capacitor array; an input terminal of the margin transfer module is connected to a power output terminal of the current rudder 321; an output terminal of the margin transfer module is interconnected with a first terminal of the margin holding capacitor module, a second terminal of the charge sharing switch module, and a first terminal of the reset switch module; a second terminal of the margin holding capacitor module and a second terminal of the reset switch module are both grounded; and a second controlled terminal of the margin transfer module, a controlled terminal of the charge sharing switch module, and a controlled terminal of the reset switch module are all connected to the control terminal of the logic control circuit 312.

The reset switch module resets the charge of the margin holding capacitor module based on the control of the logic control circuit 312. The sampling switch circuit inputs the externally input differential analog signal to the DAC capacitor array based on the control and activation of the logic control circuit 312. The current rudder 321 controls the current sources of different bits to generate current by inputting a sequence of digital signals. In an embodiment, the current rudder 321 is also connected to the DSP 40. The DSP 40 is also configured to control the current rudder 321 to output a varying static operating current, for example, to output a static operating current within a range of 50 µA to 150 µA, so as to keep the gain of the margin transfer module constant.

The margin transfer module outputs the static operating current generated by the current rudder 321 to the margin holding capacitor module for charging based on the differential margin signal and the control of the logic control circuit 312, when receiving the differential margin signal generated on the DAC capacitor array. The charge sharing switch module, based on the control of the logic control circuit 312, after the sampling of the DAC capacitor array is completed, shares the charge of the margin holding capacitor module and the DAC capacitor array, and generates a new differential margin signal for the next margin transfer.

The differential margin signal of each transfer is the same and is accumulated to the next conversion, thereby realizing first-order noise shaping and achieving higher conversion accuracy.

The margin transfer module (not shown) includes a first PMOS tube Q2 and a second PMOS tube Q3. The reset switch module includes a first switch tube Q1 and a second switch tube Q4. The input terminals of the first switch tube Q2 and the second switch tube Q3 are the input terminals of the margin transfer module. The controlled terminal of the first switch tube Q1 and the second switch tube Q4 are connected to the reset terminal of the logic control circuit and reset RES when receiving a reset signal. The output terminal of the first switch tube Q1 is connected to the source of the first PMOS tube Q2. The second switch tube Q4 is connected to the source of the second PMOS tube Q3. The drain of the first PMOS transistor Q2 and the drain of the second PMOS transistor Q3 are the output terminals of the margin transfer module. The gate of the first PMOS transistor Q2 and the gate of the second PMOS transistor Q3 are the input terminals of the margin transfer module. The drains of the first switch tube Q1 and the second switch tube Q4 are grounded.

The first switch tube Q1 receives the control signal output by the logic control circuit 312 and is turned on. The first PMOS transistor Q2 and the second PMOS transistor Q3 respectively receive the margin differential signal for biasing. According to the working principle of the MOS tube, the greater the voltage of the MOS tube, the greater the output current of the MOS tube. The differential margin signal can output bias differential signal after being biased by different MOS transistors and fixed pulse width. It should be noted that the first switch tube Q1 can be a switch with on-off capability, such as a MOS tube, a triode, etc., which is not limited here.

The margin holding capacitor module (not shown) includes a first margin holding capacitor C1 and a second margin holding capacitor C2 with the same capacitance. The first end of the first margin holding capacitor C1 is connected to the drain of the first PMOS transistor Q2. The first end of the second margin holding capacitor C2 is connected to the drain of the second PMOS transistor Q3. The second end of the first margin holding capacitor C1 and the second margin holding capacitor C2 are both grounded. The margin holding capacitor module also includes third and fourth margin holding capacitors with the same capacitance. One end of the two margin holding capacitors is connected to one end of the first sub-capacitor array and the second sub-capacitor array, and the other end is connected to the reference voltage.

As shown in FIG. 1 and FIG. 2, in a specific embodiment, the logic control circuit 312 outputs the reset signal RES to the controlled terminals of the first switch tube Q1 and the second switch tube Q4 to ground them, thereby clear the charges on the two margin holding capacitors. After the last conversion of the analog-to-digital converter is completed, when the differential margin signal (i.e., error, defined as the difference between Vop and Von) remains on the two capacitor arrays, the differential margin signal is output to the margin transfer module, the margin transfer module receives an RES signal with a fixed pulse width of T, the PMOS tube biased by the differential margin signal will charge the margin holding capacitor module, and after charging for time T, the bias differential signals are output. In this embodiment, the multiple of gain is determined by the pulse width of the RES signal, the bias circuit, the process parameters and the size of the PMOS tube. Therefore, the static operating current of the current rudder 321 can be adjusted by the DSP 40 to make the gain value fixed. In this embodiment, the multiple of gain can be set as 5.

After the margin capacitor module is charged, the sampling switch circuit controlled by the sampling control signal SAM output by the logic control circuit 312 will sample the DAC capacitor array this time and keep the differential analog signal Vinp-Vinm on the CDAC capacitor array. After the sampling is over, the logic control circuit 312 outputs the sharing control signal SHR to turn on the charge sharing switch module (not shown), and the margin holding capacitor module and the DAC capacitor array will perform charge sharing.

As shown in FIG. 1 and FIG. 2, in an embodiment, the audio ADC further includes a register (not shown), and an audio signal input interface connected to the input terminal of the programmable gain amplifier 10.

In this embodiment, the general working process of the successive approximation ADC 30 is as follows. First, the analog input signal is sampled and held by the margin holding capacitor and sent to one end of the comparator U1, and then the control logic generating circuit 30 presets the highest bit of the register to 1 and presets all other bits of the register to 0. The analog-to-digital converter outputs one-half of the reference voltage under the control of the reference voltage and the register and sends it to the other end of the comparator U1. If the analog input signal voltage is greater than one-half of the reference voltage, the comparator U1 outputs 1, and the highest bit of the register is set to 1. Otherwise, if the analog input signal voltage is less than one-half of the reference voltage, the comparator U1 outputs 0, and the highest bit of the register is set to 0. In this way, the highest bit of the successive approximation ADC 30 is determined; and then the second highest bit is determined, that is, the second highest bit of the register is preset to 1. If the most significant bit determined in the previous conversion cycle is 1, the analog-to-digital converter outputs three-quarters of the reference voltage, and the analog input signal voltage is compared with three-quarters of the reference voltage to determine the next highest bit of the register. If the most significant bit determined in the previous conversion cycle is 0, the analog-to-digital converter outputs a quarter of the reference voltage at this time, and the analog input signal voltage is compared with a quarter of the reference voltage to determine the next highest bit of the register. And so on, until the lowest bit of the register is determined, so that the value of the register is the final output of the successive approximation ADC 30.

It is understandable that, in the above embodiments, the audio ADC of the present disclosure can be applied not only to voice recognition, but also to specific sound recognition, such as clapping hands, etc. On the basis of rough recognition, it is allowed to link various other algorithms or functions for further voice feature recognition to enhance the accuracy of voice recognition.

It is also understandable that in specific applications, the circuit modules of the foregoing embodiments can be implemented by hardware circuits, for example, filters, signal comparison modules, etc., or can be implemented by software methods well known in the art, which are not limited here. The above-mentioned circuit modules of the audio ADC can be integrated in an integrated circuit.

The present disclosure also provides an electronic device that includes the audio ADC for supporting voice wake-up as described above. The detailed structure of the audio ADC for supporting voice wake-up can refer to the above-mentioned embodiment, which will not be repeated here. It is understandable that since the above-mentioned audio ADC for supporting voice wake-up is used in the electronic device of the present disclosure, the embodiments of the electronic device of the present disclosure include all the technical solutions of all the embodiments of the audio ADC for supporting voice wake-up, and the achieved technical effects are also completely the same, which will not be repeated here.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. An audio analog-to-digital converter (ADC) for supporting voice wake-up, comprising:
a programmable gain amplifier having an input terminal for receiving an audio signal;
a bypass switch having an input terminal for receiving an analog audio signal; and
a successive approximation ADC having input terminals respectively connected to output terminals of the programmable gain amplifier and the bypass switch;
wherein the programmable gain amplifier is configured to gain and amplify the audio signal, the bypass switch is configured to bypass the programmable gain amplifier when turned on, and output the analog audio signal;
wherein the successive approximation is configured to perform analog-to-digital conversion with noise shaping on the analog audio signal after gain amplification at a first sampling rate/oversampling rate when the audio ADC is in a normal working mode, and the successive approximation is configured to turn off noise shaping when the audio ADC is in a sleep mode, perform analog-to-digital conversion on the analog audio signal output by the bypass switch at a second sampling rate/oversampling rate, and output the analog audio signal after the analog-to-digital conversion to a digital signal processor (DSP) to wake up the DSP; and
wherein the first sampling rate/oversampling rate is greater than the second sampling rate/oversampling rate.

2. The audio ADC for supporting voice wake-up of claim 1, wherein the second sampling rate/oversampling rate is 1 to 16.

3. The audio ADC for supporting voice wake-up of claim 1, wherein when the audio ADC is in the normal working mode, a dynamic range of the successive approximation ADC is greater than 90 dB; and when the audio ADC is in the sleep mode, a dynamic range of the successive approximation ADC is 70 dB.

4. The audio ADC for supporting voice wake-up of claim 1, wherein the successive approximation ADC comprises a successive approximation analog-to-digital conversion module and a noise shaping circuit, an input terminal of the successive approximation analog-to-digital conversion module is connected to an output terminal of the programmable gain amplifier, a margin transfer output terminal of the successive approximation analog-to-digital conversion module is connected to an input terminal of the noise shaping circuit, and an output terminal of the noise shaping circuit is connected to a margin input terminal of the successive approximation analog-to-digital conversion module;
the noise shaping circuit is configured to transfer a margin signal of the successive approximation analog-to-digital conversion module; and
the successive approximation analog-to-digital conversion module is configured to control the noise shaping circuit to stop working after the audio ADC is in the sleep mode, to turn off the noise shaping, and perform analog-to-digital conversion on the analog audio signal output by the bypass switch.

5. The audio ADC for supporting voice wake-up of claim 4, wherein the successive approximation analog-to-digital conversion module comprises a comparator, a sampling switch circuit, a logic control circuit, a margin transfer switch circuit and a DAC capacitor array, the DAC capacitor array comprises a first DAC capacitor array and a second DAC capacitor array forming a differential structure;
a control terminal of the logic control circuit is respectively connected to a controlled terminal of the sampling switch circuit, a controlled terminal of the margin transfer switch circuit, and a controlled terminal of the noise shaping circuit;
a first terminal of the sampling switch circuit is configured to input a differential analog audio signal, a second terminal of the sampling switch circuit is connected to a first input terminal of the DAC capacitor array, a first output terminal of the DAC capacitor array is connected to an input terminal of the margin transfer switch circuit; and two input terminals of the comparator are connected to the input terminal of the noise shaping circuit, and an output terminal of the comparator is connected to an input terminal of the logic control circuit.

6. The audio ADC for supporting voice wake-up of claim 4, wherein the logic control circuit comprises a SAR logic controller and a clock generator; a control terminal of the SAR logic controller is connected to a controlled terminal of the sampling switch circuit, and a signal terminal of the clock generator is connected to a signal terminal of the SAR logic controller;

the clock generator is configured to output a fixed-width pulse signal to the SAR logic controller, to make the SAR logic controller control the noise shaping circuit to operate; and the SAR logic controller is configured to output a control signal to control the controlled terminal of the sampling switch circuit and the margin transfer switch circuit to operate.

7. The audio ADC for supporting voice wake-up of claim 6, wherein:

the noise shaping circuit comprises a margin transfer module, a margin holding capacitor module, a current rudder, a reset switch module, and a charge sharing switch module;

a first controlled terminal of the margin transfer module is connected to the DAC capacitor array;

an input terminal of the margin transfer module is connected to a power output terminal of the current rudder;

an output terminal of the margin transfer module is interconnected with a first terminal of the margin holding capacitor module, a second terminal of the charge sharing switch module, and a first terminal of the reset switch module;

a second terminal of the margin holding capacitor module and a second terminal of the reset switch module are both grounded; and a second controlled terminal of the margin transfer module, a controlled terminal of the charge sharing switch module, and a controlled terminal of the reset switch module are all connected to the control terminal of the logic control circuit.

8. The audio ADC for supporting voice wake-up of claim 7, wherein the current rudder is also connected to the DSP, and the DSP is configured to control the current rudder to output a changing static working current to keep a gain of the margin transfer module constant.

9. The audio ADC for supporting voice wake-up of claim 1, wherein the audio ADC further comprises a register, and an audio signal input interface connected to the input terminal of the programmable gain amplifier.

10. An electronic device, comprising the audio ADC for supporting voice wake-up of claim 1.

* * * * *